United States Patent [19]

Hein et al.

[11] Patent Number: 4,666,821

[45] Date of Patent: May 19, 1987

[54] PHOTOPOLYMER FOR USE AS A SOLDER MASK

[75] Inventors: Paul R. Hein, Marietta; Henry C. Miller, Douglasville; W. Darlene Brewster, Marietta, all of Ga.

[73] Assignee: W. R. Grace & Co., Cambridge, Mass.

[21] Appl. No.: 708,758

[22] Filed: Mar. 6, 1985

Related U.S. Application Data

[62] Division of Ser. No. 538,088, Feb. 23, 1984, abandoned.

[51] Int. Cl.[4] .................... G03C 5/16; G03C 1/74
[52] U.S. Cl. .................... 430/311; 430/284; 430/327; 430/325; 430/330; 427/54.1; 427/53.1; 427/56.1; 427/96; 522/96
[58] Field of Search ........... 430/284, 311, 327, 325, 430/330; 427/54.1, 53.1, 56.1, 96; 204/159.19; 522/96

[56] References Cited

U.S. PATENT DOCUMENTS

| | | | |
|---|---|---|---|
| 3,954,584 | 5/1976 | Miyata et al. | 430/284 |
| 4,182,830 | 1/1980 | Ford, Jr. | 528/75 |
| 4,188,455 | 2/1980 | Howard | 428/423.1 |
| 4,234,676 | 11/1980 | Hein et al. | 430/286 |
| 4,254,230 | 3/1981 | Howard | 525/28 |
| 4,260,703 | 4/1981 | Hodakowski et al. | 525/455 |
| 4,263,366 | 4/1981 | Lorenz et al. | 428/332 |
| 4,283,480 | 8/1981 | Davies et al. | 427/54.1 |
| 4,330,657 | 5/1982 | Disteldorf et al. | 528/58 |
| 4,377,679 | 3/1983 | Schmidle | 528/75 |
| 4,390,662 | 6/1983 | Ando et al. | 525/28 |
| 4,416,750 | 11/1983 | Murphy et al. | 204/159 |
| 4,442,198 | 4/1984 | Tsao et al. | 430/311 |
| 4,451,523 | 5/1984 | Nativi et al. | 428/209 |
| 4,499,163 | 2/1985 | Ishimaru et al. | 430/325 X |

*Primary Examiner*—John E. Kittle
*Assistant Examiner*—Cynthia Hamilton
*Attorney, Agent, or Firm*—William L. Baker; Stacey L. Channing; John J. Wasatonic

[57] ABSTRACT

A polymer suitable for use as a solder mask comprised of an acrylated or methacrylated polyurethane having terminal alkene unsaturation at each end has been synthesized. This polymer can be a liquid or a hot melt and when in a photopolymerizable composition it is suitable for roller coating or screen printing onto a printed circuit board substrate.

10 Claims, No Drawings

PHOTOPOLYMER FOR USE AS A SOLDER MASK

This is a division of application Ser. No. 583,088, filed Feb. 23, 1984, abandoned.

BACKGROUND OF INVENTION

In the past solder mask has been applied to a printed circuit board substrate by a variety of wet and dry techniques including screen printing (wet) and lamination (dry film).

The screen printing method provides for selective deposition of a liquid material onto a circuit board substrate. When a small number of printed circuits of a particular design is to be made, hand screen printing may be used. When a large number of printed circuits of the same design is to be made, machine screen printing of the desired circuit is used.

In what may be termed conventional screen printing, the liquid material is selectively deposited on the substrate and then the solvent in which the screen printable material is dissolved is removed by drying in an infrared oven. Although conventional screen printable material is relatively inexpensive, the process of infrared drying is costly and cumbersome because it requires specialized equipment for off line drying and additional manufacturing space and personnel.

Additonally, in the past solder mask has been applied as a dry film using lamination processes. Generally, when a dry film solder mask is used it is applied to the substrate via vacuum techniques. Thereafter, the board is exposed to ultraviolet light and the film is cured where exposed. After the selective exposure, the board is developed in a multitude of solvents including water, and the unexposed film is removed. The board is then dried by heat. Thereafter the board is postexposed in ultraviolet light. A problem with the dry film method is in its lack of automation. At various times during the dry film operation long cycle times are experienced e.g. the boards generally require a lengthy stabilization time between exposure to ultraviolet light and further processing. Additionally, in dry film processes a cover sheet is used which is cumbersome and time consuming to remove. The dry film technique also has the drawback of limiting the thickness of the solder mask to the preselected thickness of the film.

In addition to the conventional method of applying a liquid screen printable solder mask discussed herein, another method of applying a liquid solder mask has been suggested. In this method liquid polymer which is directly curable by ultraviolet radiation is coated, preferably by roller coating, onto a printed circuit board substrate. In this method a phototool having a solder mask design is placed in close relationship to the liquid coating and light is applied through the phototool. After the selective exposure, the unexposed liquid polymer is removed, thereby exposing metal areas which can be coated with solder.

Although in the past several different materials have been used as a solder mask, because of the physical and chemical properties necessary for an effective solder mask, it has been viewed as difficult, if not impossible, to find a solder mask which is directly curable by ultraviolet radiation and which can be coated by means of a roller coater onto a circuit board substrate. The inventors herein have discovered a new material which is curable by ultraviolet radiation and has the physical properties, electrical properties and solderability necessary to allow it to be used as a solder mask. Additionally, this new material has a unique combination of physical and chemical properties which allow it to be applied via roller coating techniques, as well as by conventional screen printing methods. Further, since this new material is directly curable by ultraviolet light it has the advantage that it is be applied to the printed circuit board substrate as a solventless liquid thus eliminating the costly and cumbersome step of infrared drying which is necessary in conventional screen printing methods. Moreover, since the new material is applied as a liquid or a hot melt the vacuum lamination process and other steps used in dry film techniques are avoided. The solder mask of the present invention has the additional advantage that the user is able to adjust the thickness of the solder mask material to his individual and varying needs.

SUMMARY OF INVENTION

In brief summary, the polymer which has been synthesized is an acrylated/methacrylated polyurethane having terminal alkene unsaturation at both ends and a molecular weight of about 1,000 to about 50,000. This polymer has the general formula:

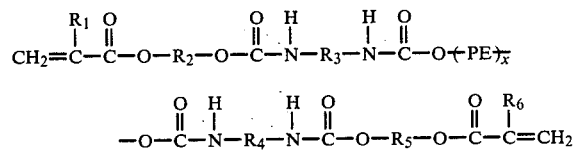

wherein $R_1$ and $R_6$ are the same or different and each is selected from the group consisting of hydrogen, methyl and ethyl, $R_2$ and $R_5$ are the same or different and each is selected from the group consisting of an alkyl group having 1 to 6 carbon atoms, $R_3$ and $R_4$ are the same or different and each is selected from the group consisting of an alicyclic, aryl, alkyl and arylalkyl group, and $-(PE)_x$ is a difunctional or polyfunctional polyester and/or polyether chain extender unit where X is from 2 to 50.

The polymers of the present invention may be synthesized in various ways. In a preferred method a diisocyanate is reacted with a hydroxy terminated acrylate or methacrylate to form a monoisocyanate urethane adduct. This acrylate or methacrylate provides the dual terminal unsaturation of the polymer composition. The urethane adduct is then reacted with a chain extending difunctional or polyfunctional polyester and/or polyether to produce the polymer of the present invention which has terminal alkene unsaturation at both ends.

DETAILED DESCRIPTION

The polymers of the present invention have terminal alkene unsaturation at each end and have a molecular weight of about 1,000 to about 50,000.

These polymers may be synthesized using any polyisocyanate having the general formular $R(NCO)_y$, where y is at least 2 and where R is a polyvalent organic moiety free from reactive carbon to carbon unsaturation.

Where y is 2, the preferred $R(NCO)_y$ includes hexamethylenediisocyanate, toluene diisocyanate, xylylene diisocyanate, diphenylmethane diisocyanate, phenylene diisocyanate, naphthalene diisocyanate, Hylene W, isophorone diisocyanate. The hydroxy terminated acrylate or methacrylate which is reacted with the polyisocyanate is utilized to provide the dual terminal alkene unsaturation of the polymer. Any hydroxyalkyl acrylate or hydroxyalkyl methacrylate which reacts with the polyisocyanate can be used. Non-limiting examples of useful hydroxy terminated acrylates and methacrylates are hydroxyethyl acrylate, hydroxypropyl acrylate, hydroxybutyl acrylate, hydroxyisobutyl acrylate, hydroxyisopentyl acrylate, hydroxyhexyl acrylate, and hydroxyethyl methacrylate, hydroxypropyl methacrylate, hydroxybutyl methacrylate, hydroxyisobutyl methacrylate, and hydroxypentyl methacrylate.

The polyiisocyanate and the hydroxy terminated acrylate or methacrylate are reacted. A catalyst is preferably used in the reaction and can be admixed with the polyisocyanate. Urethane catalysts such as dibutyl tin dilaurate or stannous octoate are suitable for use. A catalyst promotor such as an organic phosphite can also be used. The hydroxy terminated acrylate or methacrylate is added slowly to the polyisocyanate and the exotherm is controlled so that the temperature of the mixture does not exceed about 85° C., and preferably does not exceed about 70° C. The reaction is complete when essentially all of the hydroxyl groups of the acrylate or methacrylate have been reactively consumed. This point can be checked by titrating a sample of the reacted solution with dibutylamine to determine the remaining isocyanate content of the polyisocyanate.

After it is determined that the required amount of isocyanate content has been consumed, a polyester and/or polyether is added. The polyester and/or polyether functions primarily as a chain extender and can be any difunctional or polyfunctional polyester or polyether or combination thereof having a molecular weight of about 250 to about 30,000. The preferred molecular weight is 1,000 to 10,000. The polyester and polyether can have essentially any structure as long as the structure contains two or more hydroxyl groups which are reactive with the remaining isocyanate group of the polyisocyanate. Suitable chain extending polymers are poly(diethyleneglycol adipate), poly(ethylene glycol adipate, poly(ethylene oxide), poly(propylene oxide, poly(tetramethylene oxide), poly(ethylene oxide-propylene oxide) copolymer, poly(nonamethylene oxide), poly(caprolactone) and poly(trimethylolpropane-propylene oxide). There are yet many other polyethers and polyesters which could be used in the synthesis of the present polymers. The only requirement is that the polyester or polyether have the capability to react with at least two isocyanate groups. The preferred polyether is a polyoxy propylene adduct with glycerine having molecular weight of about 700 to about 800.

In a modification of the process for making the polymers of this invention a compound to modify the hardness of cured alkene terminated polymer can be co-synthesized along with the alkene terminated polymer. Such compounds have the general formula:

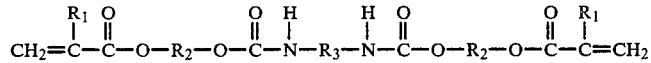

wherein $R_1$, $R_2$, and $R_3$ are the same as for the alkene terminated polymer. To co-synthesize this compound, the reactant concentrations of polyisocyanate and of the hydroxy terminated acrylate or methacrylate in the step of synthesizing the alkene terminated polymer are adjusted so as to produce the desired amount of the above compound. That is, one additional mole of polyisocyanate and two additional moles of hydroxy terminated acrylate or methacrylate are added in the first step of the above described preferred reaction sequence.

The liquid polymers of the present invention are photopolymerizable and developable using alkaline solutions. It has also been discovered that there can be produced a readily photopolymerizable and alkaline developable hot melt composition which is suitable for use as a solder mask. That is, a polymer composition which can be heated above ambient temperature, applied to the circuit board substrate as a melt, and returned to a nonfluid or less fluid state by cooling and thereafter selectively contacted with actinic light to cure the polymer in certain areas. The uncured polymer can be removed by means of an alkaline rinse or heating the substrate to melt the uncured polymer so that it can be removed as a liquid. Such hot melt polymers have the following general structure:

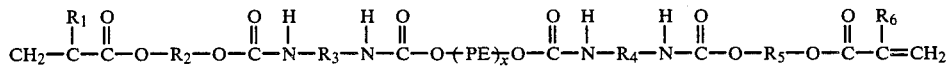

wherein, $R_1$, $R_2$, $R_5$, $R_6$ and $-(PE)-$ and X have the same meaning as set forth above. $R_3$ and $R_4$ are $(CH_2)_6$. In essence the hot melt compositions of the present invention are formed by using hexamethylene diisocyanate as the reactive diisocyanate.

When the polymers of the present invention are used in photopolymerizable composition which will be polymerized by actinic light a photoinitiator may be added. Useful photoinitiators are benzophenone, acetophenone, acenaphthenequinone, o-methoxybenzophenone, dibenzosuberone, anthraquinone, hexanophenone and 2,2 dimethoxy-2-phenyl acetophenone. Further, any other photoinitiator which would promote free-radical polymerization of the acrylate group could be used.

Depending on the specific intended method of applying the solder mask to the substrate other materials besides those already set out are added. For instance if it is desired to use the polymer as a screen-printable, a thickening agent, such as talc, Modaflow, Syloid, Cabosil or Aerosil, is added. Other additives which can be incorporated into the compositions are epoxy acrylates, multifunctional acrylates, such as hexanediol diacrylate, a multifunctional thiol, such as pentaerythritol-tetra-kis (B-mercaptopropionate), and a phenolic stabilizer, such as hydroquinone mono-methyl-ether or trihydroxy benzene. These additives serve to stablize the compositon and also provide means for bridging the polymerized alkene terminated acrylate or methacrylate to itself and also to other components.

In the preferred embodiment, the alkene terminated polymers of the present invention are used in a photopolymerizable composition which includes a photoinitiator and is coated onto a metal clad circuit board blank by any of the usual wet processing techniques. That is, the photopolymerizable composition can be thickened and applied to parts of the circuit board blank by screen printing, or it can be applied to the full circuit board blank, e.g. by roller coating and in a later step be selectively imaged. When the photopolymerizable composition is screen printed onto the circuit board blank it need only be exposed to actinic light to cure and solidify the polymer to create the solder resist. This cured polymer then protects the underlying metal during the subsequent soldering process and acts as a permanent protection against the elements because it is left as a permanent finish on the circuit board.

When the photopolymerizable composition is coated onto the full circuit board it is then selectively imaged in a subsequent step to cure it in certain areas to a solid while the portion which is not exposed remains liquid. This selective curing is accomplished by placing a phototool which has opaque areas and transparent areas above the coated surface. Actinic light is then focused onto the phototool, passes through the phototool in the transparent areas, and cures the composition which it contacts to a solid. The portion which is not contacted by the light remains liquid and is removed by wiping or by an alkaline wash. The portion of the photopolymerizable composition which is cured is firmly attached to the metal of the circuit board blank and protects the underlying metal during the solder process. After the liquid photopolymerizable composition of the present invention is cured it acts as a permanent conformal coating and in that respect will protect the underlying circuit board against the elements during its life time.

Various modifications can be made to the present polymers, their method of synthesis, such as the reaction step sequence, or in the ways they can be used. However, any such modifications are within the skill of one in the art in view of the disclosures in this application for a patent.

The following examples set forth the present invention in more detail:

EXAMPLE I

This example sets forth a process for making one of the preferred liquid polymers of the present invention.

A resin kettle was fitted with a stirrer, thermometer, drying tube connected to an air sparge tube, and an addition funnel. 375 g. of Desmodur W (methylene-bis-(4 cyclohexyldiisocyanate)) was placed in the kettle. This was follwed by the addition of 184 g. of hydroxypropyl acrylate, 150 g. of hexanediol diacrylate (HDDA), 0.28 g. of stannous octoate and 0.015 g. of triphenylphosphite. During the entire reaction process, the mixture was continuously sparged with dry air and was placed in a water bath such that temperatures could be controlled. The temperature was maintained at 170°–180° F. for one hour at which time substantially all of the hydroxyl groups were consumed and the NCO content reached 2.0±1 meq/gm as determined by titration with dibutylamine. At that time, 0.28 g. stannous octoate and 0.37 g. methoxy hydroquinone, were added with stirring. 150 g. of HDDA was then added maintaining 140°–150° F. for 30 minutes. Then 366 g. of a polyether thiol (Poly G 36-232) were added. This is an exothermic reaction and the temperature must be controlled by a water bath so as not to exceed 180° F. When exotherm was complete, heating continued at 150°–160° F. for one hour. It was then determined by amine titration that all isocyanate had been consumed. At this time 0.45 g. methoxyhydroquinone, 0.17 g. pyrogallol and 0.45 g. phosphorous acid were added and mixture stirred for 45 minutes.

The final product had a 2000–4000 cps viscosity when taken at 160° F.

EXAMPLE II

This example sets forth the use of the polymer of Example I in a roll coatable solder mask composition.

The roll coatable solder mask composition has the following formulation:

| Component | % By Weight |
|---|---|
| Polymer of Example 1 | 9.0 |
| Diethylene Glycol Dimethacrylate | 7.9 |
| Celrad 3700 (Bisphenol A Epoxydiacrylate) | 15.3 |
| Celrad 3702 (Bisphenol A Ethoxylated Diacrylate) | 7.6 |
| Ethoxylated Bis Phenol A Dimethacrylate | 9.0 |
| Methoxy Hydroquinone | .02 |
| Pyrogallol | .05 |
| Triphenylphosphite | .03 |
| Lithene PL | 2.0 |
| Irgacure | 2.0 |
| Benzophenone | 3.0 |
| Polymist F5A | 8.8 |
| Hydral Alumina | 8.8 |
| Antimony Oxide | 4.6 |
| Isobornyl Acrylate | 7.9 |
| Penn Color Green (Pigment) | 1.2 |
| Pentaerythritol Tetra-kis-(B—Mercaptopropionate) | 12.8 |

This material was applied by roll coater to a tin/lead plated through hole circuit board. The material was then selectively cured by exposure through a phototool to actinic radiation. Polymer in non-imaged areas was removed by a water/surfactant spray. The board was then rinsed, dried and exposed to intense radiation to achieve its full physical properties. This process yielded a circuit board that was masked in all areas except where electrical components were to be soldered on. The mask coating possessed sufficient physical integrity and adhesion to survive the standard wave soldering processes used in the printed circuit board industry with the commonly used fluxes. The mask retained its adhesion and physical integrity through this process and allowed solder to adhere to the circuit only in non-imaged areas. In addition, the mask passed the electrical properties tests, i.e., insulation resistance, moisture resistance, and flame retardance, required of solder mask.

EXAMPLE III

This example sets forth a process for making a hot melt polymer composition.

A resin kettle is fitted with a stirrer, thermometer, drying tube and an addition funnel. 129 g. of hydroxypropylacrylate, 139 g. of hexamethylene diisocyanate, 0.4 g. of hydroquinone monomethyl ether (MEHQ); 3.2 g. of triphenyl-phosphite and 0.08 g. of pyrogallol are added to the kettle. Upon heating the mixture to 35°–40° C., there is added 0.04 g. of stannous octoate, allowing the mixture to exotherm to 85° C. The temperature is maintained between 70°–75° C. for 2 hours at which time substantially all of the hydroxy groups are consumed, and the NCO content reaches 2.44±0.1 meq/g. as determined by titration with dibutylamine. Thereafter, 240 g. of Poly G 36 (polyoxy propylene adduct with glycerine with a molecular weight of about 800) is added along with 0.09 g. of stannous octoate. After the temperature reaches 60° C. there is added 0.12 g. of stannous octoate and the reaction mixture is held at 65° to 70° C. for approximately 6 hours until all the isocyanate groups are consumed as determined by amine titration.

EXAMPLE IV

This example sets forth the use of the polymer of Example III in a roll coatable hot melt solder mask composition.

The hot melt solder mask has the following composition:

| Component | % By Weight |
|---|---|
| Polymer of Example III | 89 |
| Stearic Acid | 4.5 |
| Pentaerythritol tetra-kis (B—Mercaptopropionate) | 3.5 |
| Benzophenone | 0.9 |
| Irgacure, Irgazine Blue, DC-193 Surfactant and Hydroquinone monomethyl ether | 2.4 |

This composition is applied by roll coater at about 55° to 60° C. to a tin/lead plated through hole printed circuit board. Upon cooling the coating solidifies. The coating is then selectively cured by exposure through a phototool to actinic radiation.

Polymer in non-imaged areas is removed by a water/-surfactant spray. The board is then rinsed, dried and exposed to intense radiation to achieve its full physical properties. This process yields a circuit board that is masked in all areas except where electrical components are to be soldered on. The mask coating possesses sufficient physical integrity and adhesion to survive the standard wave soldering processes used in the printed circuit board industry with the commonly used fluxes. The mask retains its adhesion and physical integrity through this process and allows solder to adhere to the circuit only in non-imaged areas. In addition, the mask passes the electrical properties tests, i.e., insulation resistance, moisture resistance, and flame retardance, required of solder mask.

What is claimed is:

1. A method for producing a solder mask comprising:
    (a) producing a photopolymerizable composition including
        (1) a polymer comprising:

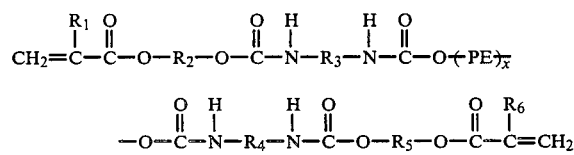

wherein $R_1$ and $R_6$ are the same or different and each is selected from the group consisting of hydrogen, methyl and ethyl; $R_2$ and $R_5$ are the same or different and each is selected from the group consisting of an alkyl group having 1 to 6 carbon atoms; $R_3$ and $R_4$ are the same or different and each is selected from the group consisting of alicyclic, aryl, alkyl and arylalkyl; and $-(PE)_x$ is selected from the group consisting of polyfunctional polyesters, polyethers and mixtures thereof having from 2 to 50 repeating units;
        (2) a photoinitiator; and
        (3) a compound having the formula:

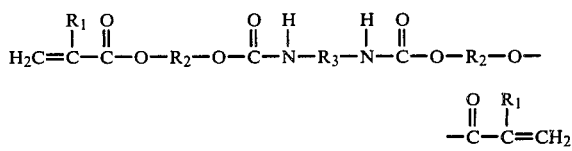

wherein $R_1$ is selected from the group consisting of hydrogen, methyl and ethyl; $R_2$ is selected from the group consisting of an alkyl group of from 1 to 6 carbon atoms; and $R_3$ is selected from the group consisting of an alicyclic, alkyl, aryl and arylalkyl group;
    (b) coating said composition onto at least a portion of a printed circuit board blank; and
    (c) contacting at least part of said coated printed circuit board blank with actinic light radiation.

2. A method of producing a solder mask comprising:
    (a) providing a photopolymerizable composition including
        (1) a polymer comprising:

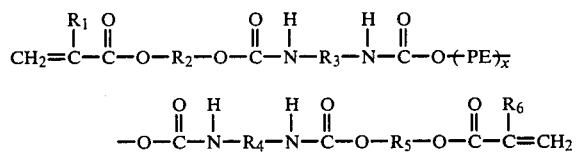

wherein $R_1$ and $R_6$ are the same or different and each is selected from the group consisting of hydrogen, methyl and ethyl; $R_2$ and $R_5$ are the same or different and each is selected from the group consisting of an alkyl group having 1 to 6 carbon atoms; $R_3$ and $R_4$ are the same or different and each is selected from the group consisting of alicyclic, aryl, alkyl and arylalkyl; and $-(PE)_x$ is selected from the group consisting of polyfunctional polyesters, polyethers and mixtures thereof having from 2 to 50 repeating units;
        (2) a photo initiator;
        (3) an additive having the formula:

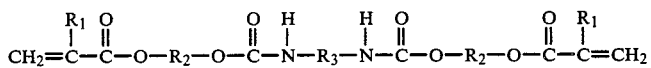

wherein $R_1$ is selected from the group consisting of hydrogen, methyl and ethyl; $R_2$ is selected from the group consisting of an alkyl group of from 1 to 6 carbon atoms; and $R_3$ is selected from the group consisting of an alkyl, aryl, alicyclic, and arylalkyl group; and
        (4) at least one multifunctional acrylate and/or multifunctional thiol;
    (b) coating said composition onto at least a portion of a printed circuit board blank; and
    (c) contacting at least part of said coated printed circuit board blank with actinic light radiation.

3. A method for producing a solder mask comprising:
    (a) providing a photopolymerizable composition including
        (1) a polymer comprising an acrylated or methacrylated polyurethane having terminal alkene unsaturation at each end, and having a molecular weight of about 1,000 to 50,000;

(2) a photoinitiator; and
(3) a compound having the formula:

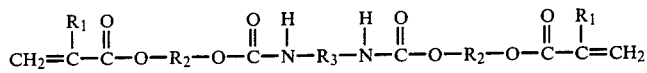

wherein $R_1$ is selected from the group consisting of hydrogen, methyl and ethyl; $R_2$ is selected from the group consisting of an alkyl group of from 1 to 6 carbon atoms; and $R_3$ is selected from the group consisting of alkyl, aryl, alicyclic, and arylalkyl group;
  (b) coating said composition onto at least a portion of a printed circuit board blank; and
  (c) contacting at least part of said coated printed circuit board blank with actinic light radiation.

4. The method for producing a solder mask as in claim 2 wherein said photoinitiator is selected from the group consisting of benzophenone, acetophenone, acenaphthenequinone, o-methoxybenzophenone, dibenzosuberone, anthraquinone, hexanophenone and 2,2-dimethoxy 2-phenylacetophenone.

5. A method for producing a solder mask as in claim 2 wherein said composition contains at least one multifunctional acrylate and/or multifunctional thiol.

6. A method for producing a hot melt solder mask comprising:
  (a) providing a photopolymerizable composition including
    (1) a polymer comprising:

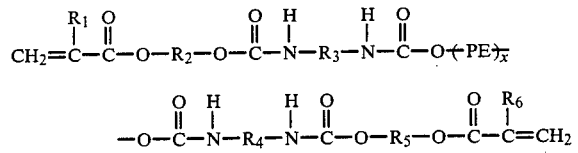

wherein $R_1$ and $R_6$ are the same or different and each is selected from the group consisting of hydrogen, methyl and ethyl; $R_2$ and $R_5$ are the same or different and each is selected from the group consisting of an alkyl group having 1 to 6 carbon atoms; $R_3$ and $R_4$ are $(CH_2)_6$; and $+PE+_x$ is selected from the group consisting of polyfunctional polyesters, polyethers and mixtures thereof having from 2 to 50 repeating units; and
    (2) a photo initiator;
  (b) heating said composition to more than 50° C. and coating said composition on at least part of a circuit board blank;
  (c) cooling said coated circuit board blank to less than 50° C.; and
  (d) contacting at least part of said coated circuit board blank, with actinic light radiation.

7. The method for producing a hot melt solder mask as in claim 6 wherein said photo initiator is selected from the group consisting of benzophenone, acetophenone, acenaphthenequinone, o-methoxybenzophenone, dibenzosubenone, anthraquinone, hexanophenone and 2,2-dimethoxy-2-phenyl acetophenone.

8. A method for producing a hot melt solder mask as in claim 6 wherein said composition contains at least one multifunctional acrylate and/or multifunctional thiol.

9. The method for producing a solder mask as in claim 3 wherein said photoinitiator is selected from the group consisting of benzophenone, acetophenone, acenaphthenequinone, o-methoxybenzophenone, dibenzosuberone, anthraquinone, hexanophenone and 2,2-dimethoxy 2-phenylacetophenone.

10. A method for producing a solder mask as in claim 3 wherein said composition contains at least one multifunctional acrylate and/or multifunctional thiol.

* * * * *